United States Patent
Kasanami et al.

(10) Patent No.: US 8,906,161 B2
(45) Date of Patent: Dec. 9, 2014

(54) SEMICONDUCTOR PRODUCING DEVICE AND SEMICONDUCTOR DEVICE PRODUCING METHOD

(75) Inventors: Katsuhisa Kasanami, Tokyo (JP); Toshimitsu Miyata, Tokyo (JP); Mitsunori Ishisaka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 233 days.

(21) Appl. No.: 12/458,096

(22) Filed: Jun. 30, 2009

(65) Prior Publication Data

US 2009/0277588 A1    Nov. 12, 2009

Related U.S. Application Data (62) Division of application No. 12/153,101, filed on May 14, 2008, now Pat. No. 7,842,160, which is a division of application No. 10/544,937, filed on Mar. 2, 2006, now abandoned.

(30) Foreign Application Priority Data

Apr. 18, 2003  (JP) ................................ 2003-113738

(51) Int. Cl.
*C23C 16/00* (2006.01)
*C23F 1/00* (2006.01)
*H01L 21/306* (2006.01)
*H01J 37/32* (2006.01)
*H01L 21/67* (2006.01)

(52) U.S. Cl.
CPC ..... *H01L 21/67103* (2013.01); *H01J 37/32082* (2013.01); *H01J 2237/2001* (2013.01)
USPC .. 118/725; 118/728; 156/345.51; 156/345.52

(58) Field of Classification Search
USPC ........................ 118/725; 156/345.52, 345.53; 219/444.1, 390
See application file for complete search history.

(56) References Cited

U.S. PATENT DOCUMENTS

| | | | |
|---|---|---|---|
| 5,231,690 A * | 7/1993 | Soma et al. | 392/416 |
| 5,280,156 A | 1/1994 | Niori et al. | 219/385 |

(Continued)

FOREIGN PATENT DOCUMENTS

| | | |
|---|---|---|
| JP | 01-104778 | 4/1989 |
| JP | 3-16122 | 1/1991 |

(Continued)

OTHER PUBLICATIONS

Japanese Office Action dated Mar. 17, 2009, including an English-language translation.

(Continued)

*Primary Examiner* — Rakesh Dhingra
(74) *Attorney, Agent, or Firm* — Kratz, Quintos & Hanson, LLP (57) ABSTRACT

A tubular electrode (215) and a tubular magnet (216) are installed on an external section of a processing furnace (202) for an MMT device. A susceptor (217) for holding a wafer (200) is installed inside a processing chamber (201) of the processing furnace. A gate valve (244) for conveying the wafer into and out of the processing chamber; and a shower head (236) for spraying processing gas in a shower onto the wafer, are installed inside the processing furnace. A high frequency electrode (2) and a heater (3) are installed inside the susceptor (217) with a clearance between them and the walls forming the space. The clearances formed between the walls forming the space in the susceptor and the high frequency electrode and the heater prevent damage to the high frequency electrode and the heater even if a thermal expansion differential occurs between the high frequency electrode, the heater and the susceptor.

14 Claims, 4 Drawing Sheets

(56) References Cited

U.S. PATENT DOCUMENTS

| | | | |
|---|---|---|---|
| 5,462,603 A | 10/1995 | Murakami | 118/719 |
| 5,886,863 A * | 3/1999 | Nagasaki et al. | 361/234 |
| 6,082,297 A | 7/2000 | Pollock et al. | 118/725 |
| 6,301,434 B1 | 10/2001 | McDiarmid et al. | 392/416 |
| 6,448,538 B1 | 9/2002 | Miyata | 219/444.1 |
| 6,494,958 B1 | 12/2002 | Shamouilian et al. | 118/728 |
| 6,740,853 B1 | 5/2004 | Johnson et al. | 219/444.1 |
| 7,230,202 B2 | 6/2007 | Hayashi et al. | 219/121.43 |

FOREIGN PATENT DOCUMENTS

| | | |
|---|---|---|
| JP | 4-324631 | 11/1992 |
| JP | 5-121333 | 5/1993 |
| JP | 7-78766 | 3/1995 |
| JP | 7-147253 | 6/1995 |
| JP | 08-078193 | 3/1996 |
| JP | 8-078193 | 3/1996 |
| JP | 08-330291 | 12/1996 |
| JP | 08-330395 | 12/1996 |
| JP | 09-153485 | 6/1997 |
| JP | 10-189227 | 7/1998 |
| JP | 11-111620 | 4/1999 |
| JP | 2000-348853 | 12/2000 |
| JP | 2002-124479 | 4/2002 |
| JP | 2002-175869 | 6/2002 |
| JP | 2002-530857 | 9/2002 |
| WO | WO 03/073489 | 9/2003 |

OTHER PUBLICATIONS

Japanese Office Action mailed on Jun. 16, 2011, in counterpart JP 2008-216308, with English Translation.

* cited by examiner

SEMICONDUCTOR PRODUCING DEVICE AND SEMICONDUCTOR DEVICE PRODUCING METHOD

This application is a divisional application of prior application Ser. No. 12/153,101, filed on May 14, 2008, now U.S. Pat. No. 7,842,160 which is a divisional of prior application of U.S. Ser. No. 10/544,937, filed on Mar. 2, 2006 now abandoned.

TECHNICAL FIELD

The present invention relates to a semiconductor producing device for plasma processing of substrates.

BACKGROUND ART

In semiconductor producing devices of this type in the prior art, the substrate for processing is loaded onto a substrate holding means installed within a vacuum container, a processing gas is supplied while the vacuum container is evacuated, and plasma discharge is generated in the processing gas by plasma generating sources of different types to subject the substrate to plasma processing using the processing gas activated by the plasma discharge.

A heater and high frequency electrode are installed within the substrate holding means in accordance with the necessary of plasma processing. The heater performs the heating of the substrate for processing. The high frequency electrode to which a high frequency voltage is applied applies a bias voltage to the substrate. This high frequency electrode is also utilized as an electrode for generating plasma within the vacuum container.

However, this type of semiconductor producing device has the problem of low heating efficiency in the heater.

The present invention therefore has the object of providing a semiconductor producing device with satisfactory heating efficiency.

The above described semiconductor producing device has the problem that during heating of the substrate by the heater, the high frequency electrode is damaged by a differential in the thermal expansion rates between the substrate holding means and high frequency electrode.

The present invention therefore has the object of providing a semiconductor producing device capable of preventing damage to the high frequency electrode.

DISCLOSURE OF INVENTION

The present invention is a semiconductor producing device for supplying a processing gas to a vacuum container, exhausting the gas, and processing a substrate, and characterized in that a substrate holding means for holding the substrate is installed inside the vacuum container, a substrate holding section for holding the substrate is provided on one side of the substrate holding means, a substrate heating means is installed in the interior of the substrate holding means, and a space on the interior of the substrate holding means where the substrate heating means is installed, connects to the atmosphere.

Damage to the substrate heating means is therefore prevented even if a difference in thermal expansion rates occurs between the substrate holding means and the substrate heating means.

The present invention is a semiconductor producing device for supplying a processing gas to a vacuum container, exhausting the gas, and processing a substrate, and characterized in that a substrate holding means for holding the substrate is installed inside the vacuum container, a space for installing a high frequency electrode is provided inside the substrate holding means, and the high frequency electrode is installed with a clearance between it and the walls forming the space, and that the space connects to the atmosphere.

Damage to the high frequency electrode is therefore prevented even if a difference in thermal expansion rates occurs between the substrate holding means and the high frequency electrode.

BEST MODE FOR CARRYING OUT THE INVENTION

One embodiment of the present invention is hereinafter described while referring to the accompanying drawings.

In the present embodiment, the semiconductor producing device of this invention is comprised of a plasma processing device (hereinafter referred to as an MMT device) utilizing a modified magnetron typed plasma source for generating high-density plasma by means of an electrical field and a magnetic field. The MMT device of this embodiment is configured to perform plasma processing of a semiconductor wafer (hereafter, called wafer) on which integrated circuit devices including semiconductor devices are produced.

A wafer is loaded in a processing chamber maintaining air-tight integrity in the MMT device. The reactive gas is fed via the shower plate into the processing chamber. The pressure within the processing chamber is maintained at a specified pressure, high frequency electric power is supplied to the discharge electrode, and along with forming an electrical field, a magnetic field is formed and magnetron discharge then occurs. The electrons emitted from the discharge electrode perform a continuous cycloid movement along the circumference while drifting, increasing the generation rate of ions due to long-life span to allow generation of high-density plasma. By exciting and breaking down the reactive gas in this way, the MMT device can subject the wafer to different types of plasma processing such as diffusion processing by oxidizing or nitriding the surface of the wafer, forming a thin film on the wafer surface and etching the wafer surface.

Figure 1:
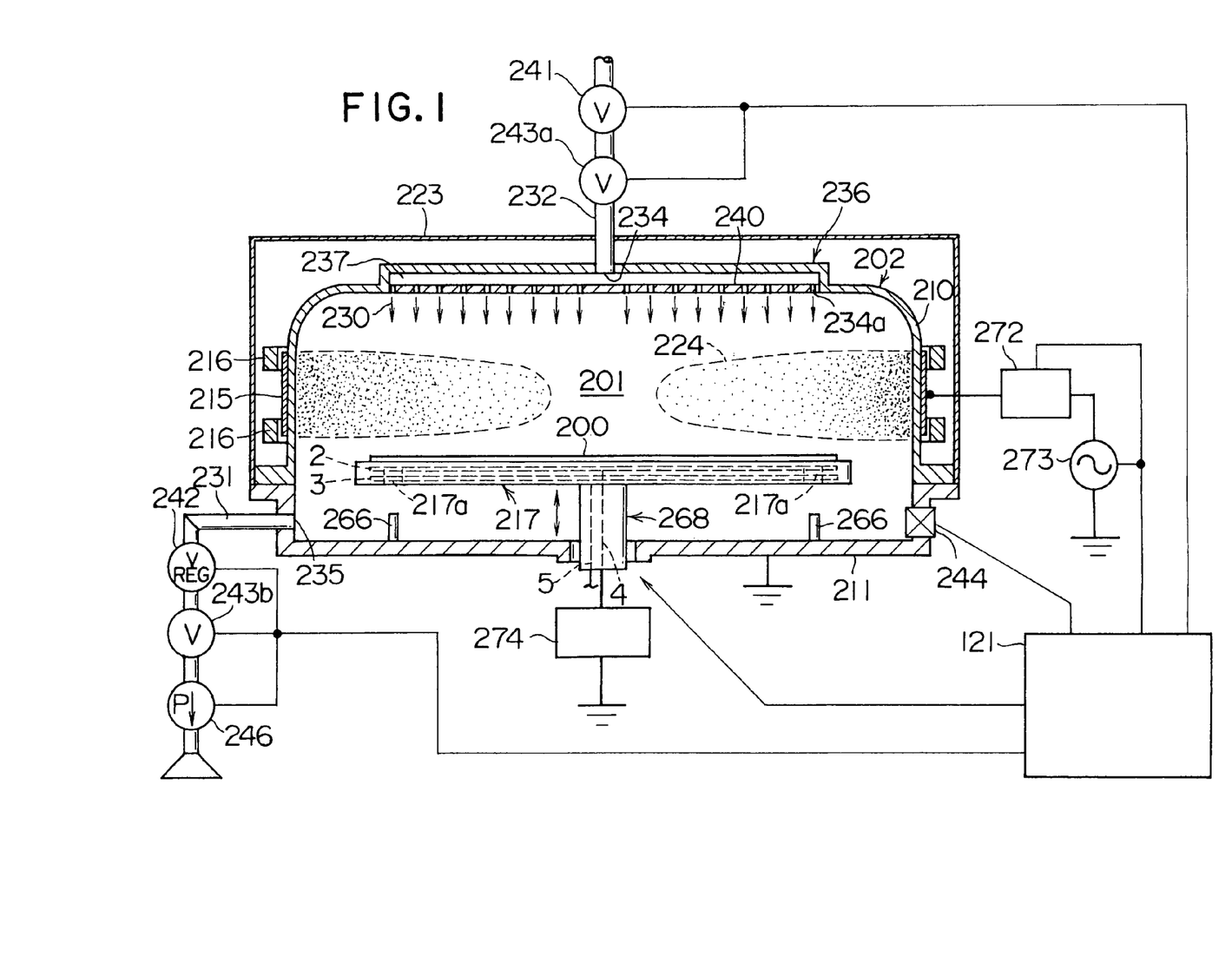
FIG. 1 is a schematic structural diagram showing the MMT device of the first embodiment of the present invention.

FIG. 1 is a schematic structural diagram showing the MMT device for plasma processing of a wafer.

The MMT device of this embodiment contains a processing chamber 201. The processing chamber 201 includes a lower side container 211 as a second container and, an upper side container 210 as a first container covering the lower side container 211 from above. The upper side container 210 is formed in a dome shape from aluminum oxide or quartz, and the lower side container 211 is formed from aluminum. Incidentally, forming a susceptor 217 serving as the heater type substrate holding means described later, from quartz or aluminum nitride reduces metal contamination of the film during processing.

A shower head 236 forming a buffer chamber 237 serving as the gas dispersion space, is provided in the upper side of the upper side container 210. A gas feed port 234 serving as a gas feed port is provided on the upper wall of the shower head 236. The lower wall of the shower head 236 is formed by a shower plate 240 containing gas spray holes 234a as the spray outlet for spraying gas. The gas feed port 234 is connected via a gas supply pipe 232 serving as a supply pipe for supplying gas to the gas bomb (not shown in drawing) of a reactive gas 230. A valve 243a serving as a switching valve, and a mass flow controller 241 serving as the flow regulator means are installed on the gas supply pipe 232. A gas exhaust port 235 serving as the exhaust port for evacuating gas is provided on the side wall of the lower side container 211 for allowing the reactive gas 230 supplied from the shower head 236 to the processing chamber 201 and the gas after processing, to flow to the bottom of the processing chamber 201 from the periphery of the susceptor 217. The gas exhaust port 235 is connected via a gas exhaust pipe 231 serving as an exhaust pipe for evacuating gas, to a vacuum pump 246 serving as an exhaust device. A pressure controller (hereafter called APC) 242 and a valve 243b as a switching valve are installed on this gas exhaust pipe 231.

The MMT device contains a first electrode 215 as a discharge means for excitation of the reactive gas 230. The first electrode 215 is formed in a tubular or preferably a cylindrical shape. The first electrode (hereafter called tubular electrode) 215 is installed on the outer circumference of the processing chamber 201, and enclose a plasma generating region 224 within the processing chamber 201. A high frequency power supply 273 for applying high frequency electric power is connected to the tubular electrode 215 via a matching transformer 272 for matching the impedance.

The MMT device contains a pair of permanent magnets 216 above and below as a magnetic field forming means. The permanent magnets 216 are formed in a tubular or preferably a cylindrical shape. The pair of permanent magnets (hereafter called tubular magnets) 216, 216 are installed near the upper and lower ends of the external surfaces of the tubular electrode 215. These upper and lower tubular magnets 216, 216 respectively possess poles on both ends (inner circumferential end and outer circumferential end) along the radius of the processing chamber 201. These poles of the tubular magnets 216, 216 are set facing each other in opposite directions. The poles on the inner circumferential section are therefore of different polarities. Magnetic lines of force are therefore formed towards the cylindrical axis along the inner circumferential surface of the tubular electrode 215.

Figure 2:
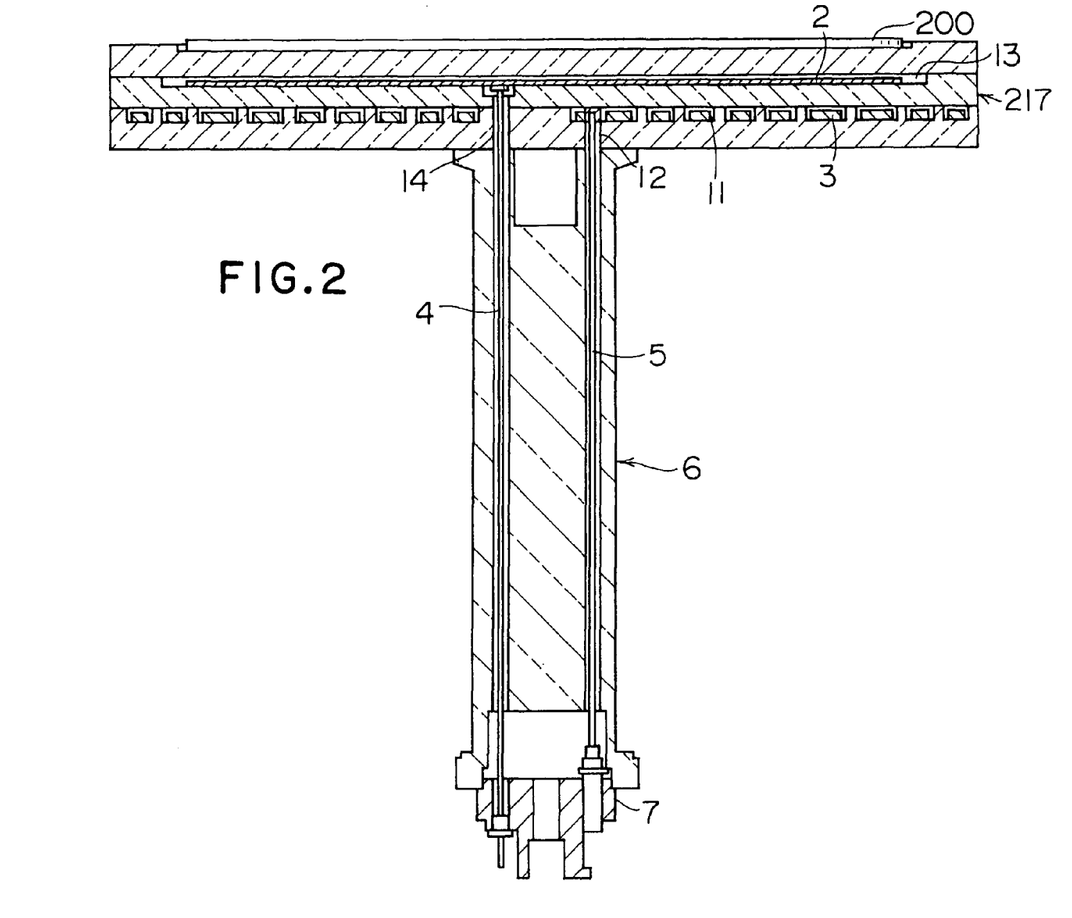
FIG. 2 is a frontal cross sectional view showing the susceptor.

As shown in FIG. 1, the susceptor 217 is installed in the center on the bottom side of the processing chamber 201 as a substrate holding means for holding the substrate for processing. The detailed structure of the susceptor 217 is shown in FIG. 2. The susceptor 217 is supported by a cylindrical shaft 6, and a cover 7 covers the bottom end opening of the shaft 6. The susceptor 217 is formed from quartz. Forming the susceptor 217 from quartz yields superior resistance to heat and prevents metal contamination of the wafer 200. The shaft 6 is also formed from quartz. Forming the shaft 6 from quartz yields superior resistance to heat and prevents metal contamination of the wafer 200. Moreover, the effect is obtained that the shaft 6 can be easily welded to the susceptor 217.

A heater 3 is installed inside the susceptor 217 as a heating means for heating the substrate for processing. In other words, a heater installation space 11 is formed in the interior of the susceptor 217, and the heater 3 is installed with a specified clearance within the heater installation space 11. The heater installation space 11 connects to the atmosphere by way of a heater wire insert hole 12. By connecting the heater installation space 11 to the atmosphere, the effect is obtained that a sealed structure for the susceptor 217 can be easily formed. The heater 3 is formed from silicon carbide (SiC). By forming the heater 3 from silicon carbide, anti-oxidizing properties can be maintained even at high temperature regions of approximately 700 to 750° C. Consequently, the heater installation space 11 can be connected to the atmosphere. If the heater 3 is formed for example, from carbon (C) or nickel (Ni), then in the high temperature region, heat damage will occur due to a reaction with oxygen in the atmosphere and so the heater installation space 11 can not be connected to the atmosphere. The heater 3 can be used in the high temperature region if formed from platinum (Pt) which possesses anti-oxidizing properties. However, platinum possesses little resistance, so forming the heater 3 in a thin film shape is necessary in order to set a larger resistance or setting the electric power higher to cause a large electrical current flow is necessary, sometimes causing the problem that the thin section of the heater 3 melted.

A heater wire 5 serving as a power supply element and connecting to the heater 3 is inserted through a heater wire insert hole 12. Supplying electric power to the heater 3 from the heater wire 5 allows heating the wafer 200 up to approximately 300 to 900° C. The heater wire 5 is formed from silicon carbide as the same material as structural material for the heater 3. Forming the heater wire 5 from silicon carbide as the same material as the heater 3 structural material, allows connecting the heater wire 5 to the heater 3 by welding and also yields the effect that the heater wire 5 can be exposed to the atmosphere, the same as the heater 3. The heater wire 5 along the interior of the shaft 6 extends outward to the outside from the cover 7, and connects to external wire (wiring harness, etc.) by way of the connecting element (terminal) on the outer side of the cover 7. By inserting the heater wire 5 along the interior of the shaft 6, the interior of the shaft 6 is isolated from the processing chamber 201 so that the effects caused by the reactive gas 201 in processing chamber 201 on the heater wire 5 can be prevented. The interior of the shaft 6 is connected to the atmosphere so that there is no need to construct an air-tight structure within the interior of the shaft 6 and therefore air-tight terminals such as hermetic terminals need not be utilized to connect the heater wire 5 to the external wire and costs can be reduced. The heater wire 5 made of silicon carbide is connected to external wire on the outer side of the cover 7 as the low temperature region, and by inserting it through the interior of the shaft 6 and connecting it to the heater 3 in the susceptor 7, the complete heater wiring system can be protected from heat damage without providing a cooling structure and therefore costs are reduced.

An electrode (hereafter called the second electrode) 2 for varying the impedance is installed inside the susceptor 217. In other words, an electrode installation space 13 is formed in the interior of the susceptor 217, and the second electrode 2 is installed with a specified clearance in this electrode installation space 13. The electrode installation space 13 is connected to the atmosphere by way of an electrode wire insert hole 14. By connecting the electrode installation space 13 to the atmosphere, the effect is obtained that the sealed structure of the susceptor 217 can be made a simple structure. The second electrode 2 is made from platinum. By forming the second electrode 2 from platinum, anti-oxidizing properties can be maintained even at high temperature regions of approximately 700 to 750° C. Consequently, the electrode installation space 13 can be connected to the atmosphere. Platinum possesses little resistance, so adverse effects from generating heat can be avoided even if a change occurs in the quantity for controlling the high frequency electric power on the second electrode 2. Consequently, effects exerted on the wafer 200 from the heating temperature can be suppressed.

An electrode wire 4 serving as the power supply element is inserted in the electrode wire insert hole 14 and connects to the second electrode 2. Supplying high-frequency electric power to the second electrode 2 from the electrode wire 4 allows regulating the impedance. The electrode wire 4 is formed from platinum and is same material as the structural material for the second electrode 2. Forming the electrode wire 4 from platinum as the same material as the second electrode 2 structural material, allows connecting the electrode wire 4 to the second electrode 2 by welding and also yields the effect that the electrode wire 4 can be exposed to the atmosphere, the same as the second electrode 2. The electrode wire 4 along the interior of the shaft 6 extends outward to the outside from the cover 7, and connects to external wire (wiring harness, etc.) by way of the connecting element (terminal) on the outer side of the cover 7. By inserting the electrode wire 4 along the interior of the shaft 6, the interior of the shaft 6 is isolated from the processing chamber 201 so that the effects caused by the reactive gas on the electrode wire 4 in the processing chamber 201 can be prevented. The interior of the shaft 6 is connected to the atmosphere so that there is no need to construct an air-tight structure within the interior of the shaft 6 and therefore air-tight terminals such as hermetic terminals need not be utilized to connect the electrode wire 4 to the external wire and costs can be reduced.

The electrode wire 4 made of platinum is connected to the external wire on the outer side of the cover 7 as the low temperature region, and by inserting it through the interior of the shaft 6 and connecting it to the second electrode 2 in the susceptor 217, the complete wiring system for the second electrode 2 can be protected from heat damage without providing a cooling structure and therefore costs are reduced.

As shown in FIG. 1, the electrode wire 4 for the second electrode 2 is connected to a reference potential via a variable impedance mechanism 274. The variable impedance mechanism 274 is comprised of a coil and a variable condenser. The potential of the wafer 200 can be controlled by controlling the number of coil patterns and the capacity of the variable condenser via the second electrode 2 and the susceptor 217. The second electrode 2 may be connected to the high frequency power supply side, and may be connected to the reference potential side, and needless to say can be selected if necessary.

A processing furnace 202 for processing the wafer 200 by magnetron discharge from a magnetron typed plasma source is comprised at least of the processing chamber 201, the susceptor 217, the tubular electrode 215, the tubular magnet 216, the shower head 236 and the exhaust port 235. The processing furnace 202 is capable of plasma processing of the wafer 200 in the processing chamber 201.

A blocking plate 223 is installed for blocking the electrical field and magnetic field on the periphery of the tubular electrode 215 and tubular magnet 216. This blocking plate 223 is structured to prevent the magnetic field and electrical field formed by the tubular electrode 215 and tubular magnet 216 from exerting adverse effects on the external environment and other processing furnaces, etc.

The susceptor 217 is insulated from the lower side container 211. A susceptor elevator mechanism 268 in the susceptor 217 is installed as a lifting/lowering means for lifting or lowering the susceptor 217. The susceptor elevator mechanism 268 is comprised of the shaft 6 as shown in FIG. 2, and a drive mechanism (not shown in drawing) for driving the shaft 6 up and down. Through holes 217a are formed in at least three locations on the susceptor 217. Wafer push-up pins 266 are provided in at least three locations as a substrate push-up means to push up the substrate on the bottom of the lower side container 211. The through holes 217a and the wafer push-up pins 266 are configured so that the wafer push-up pins 266 pierces in the through holes 217a on the state where the wafer push-up pins 266 are not in contact with the susceptor 217 when the susceptor 217 has been lowered by the susceptor elevator mechanism 268.

A gate valve 244 is installed in the side wall on the lower side container 211 as a sluice valve. When the gate valve 244 is open, the wafer 200 is loaded in or unloaded from the processing chamber 201 by a conveyor means (not shown in drawing). When the gate valve 244 is closed, the processing chamber 201 sealed air-tight.

The MMT device contains a controller 121 as a regulation means. The controller 121 connects to the high frequency power supply 273, the matching transformer 272, the valve 243a, the mass flow controller 241, the APC 242, the valve 243b, the vacuum pump 246, the susceptor elevator mechanism 268, the gate valve 244, and the high frequency power supply for applying high frequency power to the heater 3 embedded in the susceptor 217 in order to control them.

The method for performing the specified plasma processing on the surface of the wafer 200 or on the surface of an underlayer film formed on the wafer 200 by using the above described MMT device is described next.

The wafer 200 is loaded into the processing chamber 201 by the conveyor means (not shown in drawing) for conveying the wafer from a section outside the processing chamber 201 forming the processing furnace 202, and is sent above the susceptor 27. This conveying operation is described in detail next.

First of all, with the susceptor 217 in a lowered state, the tips of the wafer push-up pins 266 protrude through the holes 271a of the susceptor 217 and protrude to just a specified height from the susceptor 217 surface. In this state, the gate valve 244 provided in the lower side container 211 opens and the wafer 200 is loaded by the conveyance means, onto the top edges of the wafer push-up pins 266. The gate valve 244 closes when the conveyance means retracts to outside the processing chamber 201. When the susceptor 217 is raised by the susceptor elevator mechanism 268, the wafer 200 is mounted on the upper surface of the susceptor 217. The susceptor 217 then rises to the position for processing the wafer 200.

The heater 3 embedded in the susceptor 217 is preheated, and the loaded wafer 200 is heated to the wafer processing temperature within a range of 300 to 900° C. The pressure within the processing chamber 201 is maintained within a range of 0.1 to 100 Pa utilizing the vacuum pump 246 and the APC 242.

When the wafer 200 has been heated to the processing temperature, processing gas for example such as oxygen gas or nitrogen gas is supplied from the gas feed port 234 to the processing chamber 201. This processing gas is sprayed from the gas spray holes 234a of the shower plate 240, in a sprayed state, towards the upper surface (processing surface) of the wafer 200 held in the susceptor 217. The high frequency electric power is simultaneously applied to the tubular electrode 215 from the high frequency power supply 273 via the matching transformer 272. The applied electric power is an output value within a range of approximately 150 to 200 watts. The variable impedance mechanism 274 at this time controls the impedance to within the desired value.

The effect of the magnetic field from the pair of tubular magnets 216, 216 causes a magnetron discharge, an electrical charge is trapped in the space above the wafer 200, and a high-density plasma is generated in the plasma generating region 224. The plasma processing on the surface of the wafer 200 on the susceptor 217 is then performed with the high-density plasma that was generated.

The processing conditions for example when forming a plasma nitrided film as an interfacial oxidation prevention film on the surface of the wafer 200 by utilizing the MMT device are described next.

The high frequency power is 100 to 500 watts. The processing pressure is 2 to 100 Pa. The nitrogen gas flow rate is 100 to 1,000 sccm (standard cubic centimeters). The processing temperature is 25 to 600° C. The processing time is one second or longer. The film thickness is 1 to 3 nanometers.

The processing conditions for performing plasma oxidizing process for film improvement processing of the tantalum oxide film with an MMT device are as follows.

The high frequency power is 100 to 500 watts. The processing pressure is 2 to 100 Pa. The oxygen gas flow rate is 100 to 1,000 sccm. The processing temperature is 25 to 600° C. The processing time is one second or longer.

Using the conveying means (not shown in drawing), the wafer 200 whose surface processing is complete, is conveyed outside the processing chamber 201 in a sequence that is the reverse of the wafer loading sequence.

The controller 121 respectively controls the on/off switching of electric power from the high frequency power supply 273, the adjustment of the matching transformer 272, the opening/closing of the valve 243a, the flow rate of the mass flow controller 241, the degree of valve opening of the APC 242, the opening/closing of the valve 243b, the starting and stopping of the vacuum pump 246, operation for raising and lowering the susceptor elevator mechanism 268, the opening/closing of the gate valve 244, and the on/off switching of electric power to the high frequency power supply for applying high frequency power to the heater 3 embedded in the susceptor 217.

Figure 3:
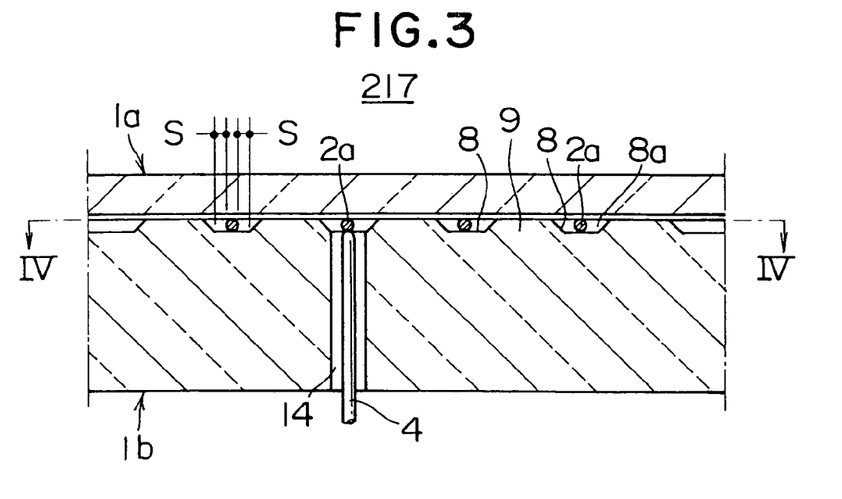
FIG. 3 is a frontal cross sectional view showing part of the susceptor of the MMT device of the second embodiment of the present invention.
Figure 4:
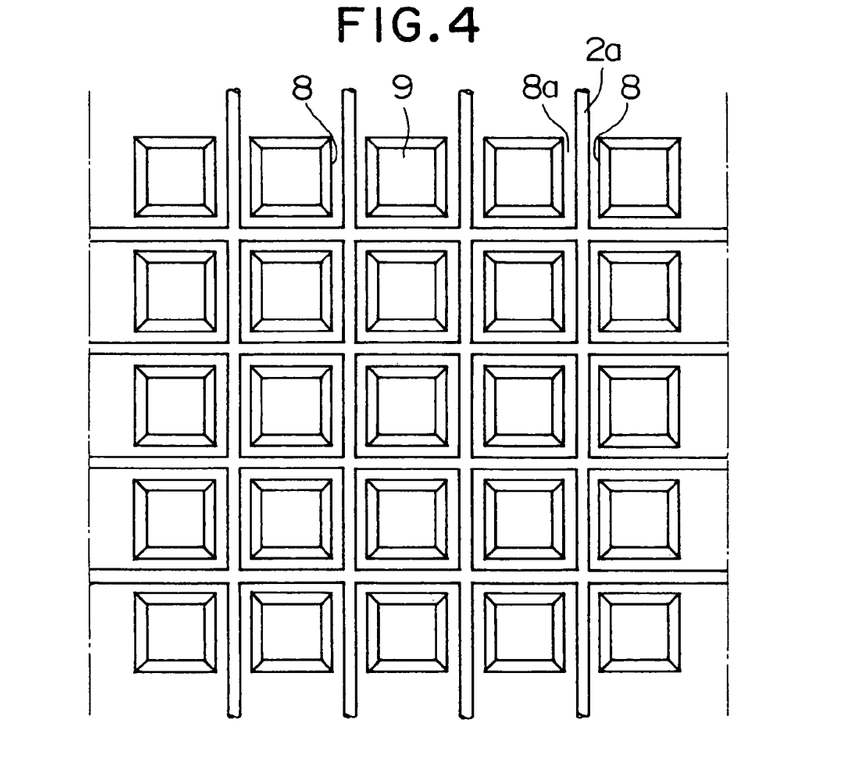
FIG. 4 is a plan view taken along line IV-IV of FIG. 3.

FIG. 3 is a frontal cross sectional view of a section of the susceptor of the MMT device of the second embodiment of the present invention. FIG. 4 is a plan view taken along line IV-IV of FIG. 3.

The susceptor 217 of this embodiment is formed from quartz or aluminum nitride. Preferably, quartz is utilized since a large temperature differential occurs within the susceptor 217 in the high temperature region for example of 500° C. or more, and the strength must be maintained. Incidentally, neither quartz or aluminum nitride do not cause metallic contamination effects on the wafer 200 which is the substrate for processing.

The susceptor 217 of the present embodiment is comprised of a first susceptor member 1a as a lid, and a second susceptor member 1b as the main piece. A groove 8 is formed in a lattice shape in the upper surface of the second susceptor member 1b. A high frequency electrode 2a in a mesh shape and serving as the second electrode is installed on the groove 8 and the first susceptor member 1a covers the top of the high frequency electrode 2a. The first susceptor member 1a and the second susceptor member 1b are attached together by adhesives or by heat weld. A space 8a is formed by the groove 8 and the first susceptor member 1a. The walls of the groove 8 and the first susceptor member 1a forming this space 8a are the walls of the space.

In the present embodiment, the groove 8 is formed at 4 millimeter intervals on the upper surface of the second susceptor member 1b. The width of the groove 8 is 1.6 millimeters. The width of a protrusion 9 formed relatively between the adjacent grooves 8 and 8 is 2.4 millimeters. The outer diameter of the high frequency electrode 2a is 1.2 millimeters smaller than the groove 8 width dimension. When the high frequency electrode 2a is installed within the groove 8, a clearance S of 0.2 millimeters is respectively formed on both sides of the high frequency electrode 2a.

The value of the distance between the adjacent grooves 8 can be set to a suitable figure as needed. The groove 8 may be formed by knurling or embossing of the known art.

The electrode wire 4 is inserted through the electrode wire insert hole 14 of the second susceptor member 1b and connected to the high frequency electrode 2a, and the space 8a within the susceptor 217 is connected to the atmosphere via the electrode wire insert hole 14. The space 8a is in this way connected to the atmosphere so that a material with electrical conductance, a high melting point and anti-oxidizing properties such as platinum or palladium or platinum rhodium alloy is preferably selected as the material of the high frequency electrode 2a. These metals are not susceptible to oxidizing effects from the atmosphere even if utilized at temperatures of 300 to 900° C. without problems such as wire breakage.

If the susceptor 217 and shaft 6, and the shaft 6 and shaft cover 7 are joined air-tightly, and the electrode wire 4 penetrates hermetically the shaft cover 7, then the space 8a within the susceptor 217 can be blocked from the atmosphere so that even materials susceptible to oxidizing effects in a temperature range of 300 to 900° C. may be utilized as the material for the high frequency electrode 2a, and material with electrical conductivity and a high melting point that does not easily melt can be used. For example, material such as molybdenum, nickel, or tungsten can be selected as this type of material.

In the present embodiment, the high frequency electrode 2a is installed with a clearance S versus the wall forming the space within the first susceptor member 1a and the second susceptor member 1b so that damage to the high frequency electrode 2a can be prevented even if the thermal expansion differential between the susceptor members 1a, 1b and the high frequency electrode 2a becomes large.

The space 8a is provided and if the material for the high frequency electrode 2a is selected according to whether there will be an inflow from the atmosphere, then damage to the high frequency electrode 2a due to a loss of strength because of oxidation can be prevented.

If the first susceptor member 1a and the second susceptor member 1b are attached air-tight by adhesive material or heat weld, then the high frequency electrode 2a can be isolated from the atmosphere of the processing chamber 201 so that the wafer 200 as the substrate for processing, can be protected from the effects of metal contamination from the high frequency electrode 2a.

Figure 5:
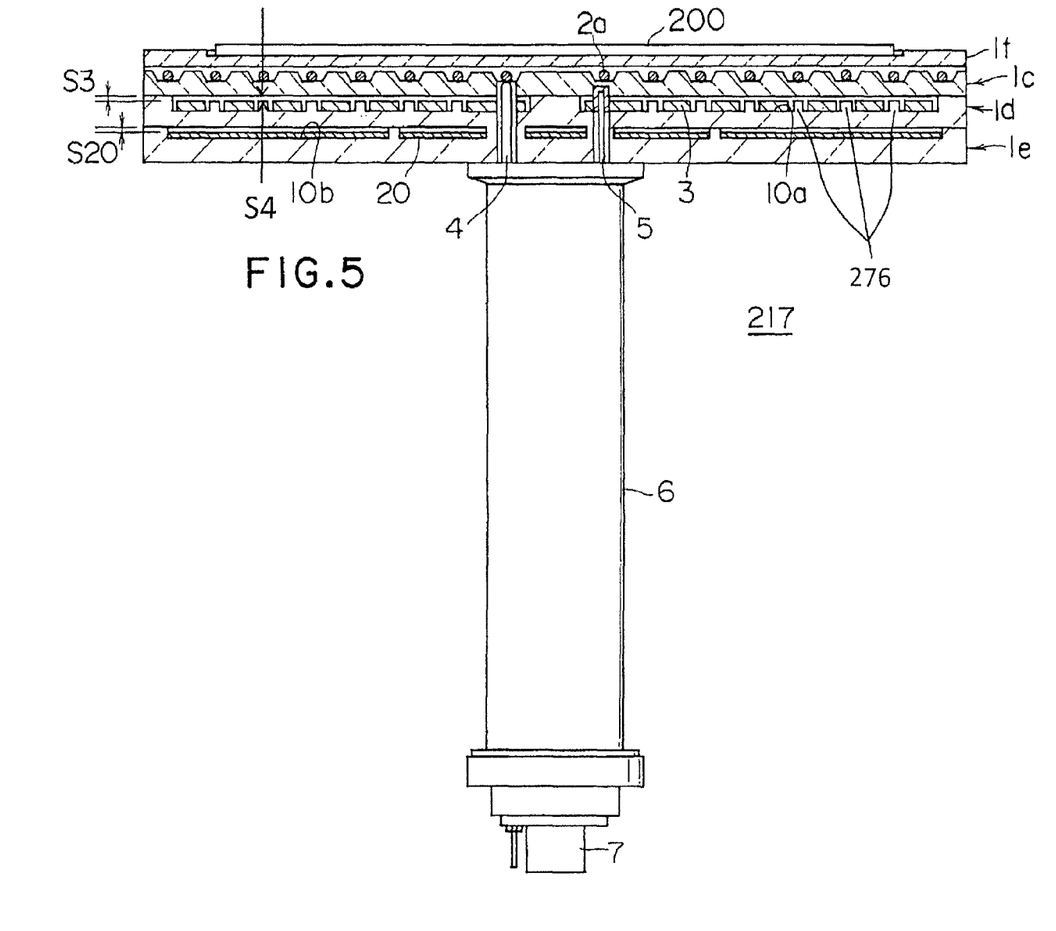
FIG. 5 is a partial cross sectional front view showing the susceptor of the MMT device of the third embodiment of the present invention.

FIG. 5 is a partial cross sectional front view showing the susceptor of the MMT device of the third embodiment of the present invention.

The overall structure of the MMT device of this embodiment and the schematic structure of the susceptor are the same as the previously described MMT device and susceptor.

The susceptor 217 of this embodiment is comprised of an upper stage susceptor member 1c and intermediate stage susceptor member 1d and lower stage susceptor member 1e and a mounting susceptor member 1f. The material is overall quartz. The high frequency electrode 2a serving as the second electrode is installed inside the upper stage susceptor member 1c.

The mounting susceptor member 1f is fabricated separately from the upper stage susceptor member 1c and clamped airtight by adhesive material or heat weld. The mounting susceptor member 1f may however be formed as one piece with the upper stage susceptor member 1c.

An upper side cavity 10a is formed on the upper surface of the intermediate stage susceptor member 1d, and the heater 3 serving as the heater means for the wafer 200 as the substrate for processing is installed on the upper side cavity 10a. Multiple projections 276 are provided in the heater installation space. The intermediate stage susceptor member 1d on the side of the upper-side cavity 10a is covered by the upper stage susceptor member 1c. The upper stage susceptor member 1c and the intermediate stage susceptor member 1d are clamped air-tight by adhesive material or heat weld.

A lower side cavity 10b is formed on the upper surface of the lower stage susceptor member 1e. A reflective member 20 is installed on the lower side cavity 10b, so as to cover the lower side surface of the heater 3 serving as the heater means for the wafer 200 as the substrate for processing. The lower stage susceptor member 1e on the side of the lower side cavity 10b is covered by the intermediate stage susceptor member 1d, and the lower stage susceptor member 1e and the intermediate stage susceptor member 1d are clamped air-tight by adhesive material or heat weld.

Assembling as described above, the heater 3 serving as the wafer heating means is arranged in a state where put between the mounting susceptor member 1f serving as the wafer holding section and the reflective member 20, and the quartz in the intermediate stage susceptor member 1d allows light to transmit through it, so that the radiant heat transmitted through the intermediate stage susceptor member 1d from the heater 3 can be reflected from the reflective member 20.

Material for the heater 3 can be selected from among any of silicon carbide, carbon, or glass carbon. The reflective member 20 may be fabricated from any of nickel, molybdenum, tungsten, platinum, palladium, or platinum rhodium alloy that is metal with a high melting point. The reflective member 20 has at least a mirror surface on the heater 3 side to reflect effectively the radiant heat towards the heater 3 side. Reflecting the radiant heat from the heater 3 by means of the reflective member 20 effectively reduces the electric power consumption by the heater 3.

A clearance S3 is provided between the heater 3 and the upper stage susceptor member 1c. A clearance S20 is also provided between the reflective member 20 and the intermediate stage susceptor member 1d. The clearance S3 and the clearance S20 prevent damage to the heater 3 due to a differential in thermal expansion between the upper stage susceptor member 1c and the heater 3; and prevent damage to the reflective member 20 due to the differential in thermal expansion between the intermediate stage susceptor member 1d and the reflective member 20. A second clearance S4 is provided between multiple projections and the upper stage susceptor member 1C.

The clearance S20 formed between the reflective member 20 and the intermediate stage susceptor member 1d may be connected to the atmosphere. In this case, any of platinum, palladium, or platinum rhodium alloy that is not susceptible to oxidizing effects is preferably used for the reflective member 20.

The clearance S20 formed between the intermediate stage susceptor member 1d and the reflective member 20 may be sealed to block the connection to the atmosphere. In this case, material such as any of nickel, molybdenum, or tungsten that is susceptible to damage from oxidizing effects may be utilized for the reflective member 20. The reflective member 20 can be manufactured at a lower cost than materials not susceptible to effects from oxidizing.

To compensate for a drop in strength due to the clearances, through holes may be formed in necessary locations in the heater 3 and in necessary locations in the reflective member 20, and in the upper stage susceptor member 1c, intermediate stage susceptor member 1d, and lower stage susceptor member 1e; and a quartz rod installed on each hole of the heater 3 without direct contact and, then clamped to the upper stage susceptor member 1c and intermediate stage susceptor member 1d by adhesives or heat weld. Also a quartz rod may be installed on each hole of the reflective member 20 without direct contact and then clamped to the intermediate stage susceptor member 1d and lower stage susceptor member 1e by adhesives or heat weld.

Also adhesives or heat weld is used between the upper stage susceptor member 1c and intermediate stage susceptor member 1d; and between the intermediate stage susceptor member 1d and lower stage susceptor member 1e to seal and clamp them so that the heater 3 and the reflective member 20 are blocked from the atmosphere in the processing chamber 210 and therefore the wafer 200 as the substrate for processing is not affected by metal contamination from the heater 3 and reflective member 20.

The explanation for the third embodiment described an example where the high frequency electrode 2a is provided on the upper stage susceptor member 1c, however the high frequency electrode 2a may be omitted.

The invention claimed is:

1. A semiconductor producing device for supplying a processing gas to a vacuum container, exhausting the gas, and processing a substrate, wherein a substrate holding means for holding the substrate is installed inside the vacuum container, a substrate holding member for holding the substrate is provided on an upper stage of the substrate holding means, a supporting member for supporting a substrate heating means is provided on a lower stage of the substrate holding means, a heating means installation space is formed between an upper surface of the supporting member and a bottom surface of the substrate holding member, the substrate heating means is installed on the bottom of the heating means installation space and installed between multiple projections of the supporting member provided on the upper surface of the supporting member, the supporting member is covered by the substrate holding member, a first clearance is provided between the substrate heating means and the bottom surface of the substrate holding member, a second clearance is provided between upper surface of the multiple projections and the bottom surface of the substrate holding member, a wire for supplying electric power to the substrate heating means is inserted in a hole in a shaft for supporting the substrate holding means, and the heating means installation space and the interior of the shaft, connect to the atmosphere, and such that the substrate heating means and the wire are directly connected to the atmosphere through the hole in the shaft, wherein the supporting member is fixed airtight to the substrate holding member by adhesives or heat weld.

2. The semiconductor producing device according to claim 1, wherein the substrate holding means is formed from quartz.

3. The semiconductor producing device according to claim 1, wherein the shaft is formed from quartz.

4. The semiconductor producing device according to claim 1, wherein the wire for supplying electric power to the substrate heating means is made of the same material as the substrate heating means, extends from the substrate heating means to an outside section of the substrate holding means, and connects to a terminal of the substrate heating means by welding.

5. The semiconductor producing device according to claim 1, wherein the substrate heating means is made from silicon carbide.

6. The semiconductor producing device according to claim 5, wherein the wire for supplying electric power to the substrate heating means is made from silicon carbide.

7. The semiconductor producing device according to claim 1, wherein the substrate heating means and the multiple projections have the upper surface in the same level.

8. The semiconductor producing device according to claim 1, wherein a supporting member for supporting a reflective member is provided below the lower stage of the substrate holding means, a reflective member installation space is formed on an upper surface of the supporting member for supporting the reflective member, the reflective member is installed on the bottom of the reflective member installation space.

9. The semiconductor producing device according to claim 8, wherein, the reflective member has a mirror surface on the side of the substrate heating means.

10. The semiconductor producing device according to claim 1, wherein a third clearance is provided between a reflective member and a top of a reflective member installation space.

11. A semiconductor producing device for supplying a processing gas to a vacuum container, exhausting the gas, and processing a substrate, wherein a susceptor for holding the substrate is installed inside the vacuum container, a substrate holding member for holding the substrate is provided on an upper stage of the susceptor, a supporting member for supporting a heater is provided on a lower stage of the susceptor, a heater installation space is formed between an upper surface of the supporting member and a bottom surface of substrate holding member, the heater is installed on the bottom of the heater installation space and installed between multiple projections of the supporting member provided on the upper surface of the supporting member, the supporting member is covered by the substrate holding member, a first clearance is provided between the heater and the bottom surface of the substrate holding member, a second clearance is provided between upper surface of the multiple projections and the bottom surface of the substrate holding member, a wire for supplying electric power to the heater is inserted in a hole in a shaft for supporting the susceptor, and the heater installation space and the interior of the shaft, connect to the atmosphere, and such that the heater and the wire are directly connected to the atmosphere through the hole in the shaft, wherein the supporting member is fixed airtight to the substrate holding member by adhesives or heat weld.

12. The semiconductor producing device according to claim 11, wherein the substrate heating means and the multiple projections have the upper surface in the same level.

13. A susceptor installed inside a vacuum container for holding a substrate, wherein a substrate holding member for holding the substrate is provided on an upper stage of the susceptor, a supporting member for supporting a heater is provided on a lower stage of the susceptor, a heater installation space is formed between an upper surface of the supporting member and a bottom surface of the substrate holding member, the heater is installed on the bottom of the heater installation space and installed between multiple projections of the supporting member provided on the upper surface of the supporting member, the supporting member is covered by the substrate holding member, a first clearance is provided between the heater and the bottom surface of the substrate holding member, a second clearance is provided between upper surface of the multiple projections and the bottom surface of the substrate holding member, a wire for supplying electric power to the heater is inserted in a hole in a shaft for supporting the susceptor, and the heater installation space and the interior of the shaft, connect to the atmosphere, and such that the heater and the wire are directly connected to the atmosphere through the hole in the shaft, wherein the supporting member is fixed airtight to the substrate holding member by adhesives or heat weld.

14. The susceptor according to claim 13, wherein the substrate heating means and the multiple projections have the upper surface in the same level.

* * * * *